(12) United States Patent
Ferguson

(10) Patent No.: US 7,009,538 B1
(45) Date of Patent: Mar. 7, 2006

(54) HIGH-SPEED DAC LINEARITY MEASUREMENT

(75) Inventor: Kevin M. Ferguson, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 11/015,958

(22) Filed: Dec. 16, 2004

(51) Int. Cl.
H03M 1/10 (2006.01)

(52) U.S. Cl. .................. 341/120; 341/144; 341/169
(58) Field of Classification Search ............... 341/120
See application file for complete search history.

(56) References Cited

U.S. PATENT DOCUMENTS

| 5,661,527 A | | 8/1997 | Ferguson | |
|---|---|---|---|---|
| 5,712,633 A | * | 1/1998 | Bae | 341/120 |
| 6,140,949 A | * | 10/2000 | Tsay et al. | 341/120 |
| 6,177,894 B1 | * | 1/2001 | Yamaguchi | 341/120 |

* cited by examiner

Primary Examiner—Peguy JeanPierre
Assistant Examiner—Khai Nguyen
(74) Attorney, Agent, or Firm—Francis I. Gray

(57) ABSTRACT

A high-speed digital-to-analog converter (DAC) measurement method acquires and quantizes an analog ramp output by the DAC corresponding to a digital ramp input to produce a quantized ramp, determines a start and end of the quantized ramp, obtains a difference between the quantized ramp and an ideal ramp to produce a quantized periodic signal (triangular or sinusoidal), determines a frequency for a qualified peak from an FFT of the quantized periodic signal, produces a mask filtered periodic signal from an iFFT around the qualified peak, and determines a sample window spanning a local maximum and minimum for each period of the quantized periodic signal. The ramp step levels are the averages of the samples within each sample window. From the step levels in DAC LSB's, resolution, monotonicity, differential lineary and integral linearity are determined for the DAC.

9 Claims, 14 Drawing Sheets

HIGH-SPEED DAC LINEARITY MEASUREMENT

BACKGROUND OF THE INVENTION

The present invention relates to digital-to-analog conversion, and more particularly to a method of high-speed digital-to-analog converter (DAC) linearity measurement in the presence of noise, quantization error and other distortions.

Linearity is an important specification in a wide variety of applications using DACs. For speed one clock period per DAC value (output level) may be required. Due to both uncorrelated and correlated (such a pixel clock) noise, distortions and other signal impairments a problem in defining a start and end of a DAC output level may arise. FIG. 1 shows a zoomed one least significant bit (LSB) step staircase "ramp" signal per the Video Electronics Standard Association (VESA) standard output from the DAC on a video graphics card. The ramp signal was acquired by a digital oscilloscope having an 8-bit data acquisition section using a 500 waveform average of a low jitter signal. Note the lack of distinct steps in many areas of the waveform.

In order to comply with existing VESA standards, computer graphics card manufacturers need to automatically measure the resolution, monotonicity, differential linearity (DNL) and integral linearity (INL) of DACs in the presence of noise and other distortions. For speed and convenience the VESA standard specifies that a video line ramp input signal is used for this purpose. Due to the number of samples per video line and the number of output levels of the DAC that need to be measured, these ramps often are limited to one pixel per level at pixel rates of hundreds of mega-pixels per second. At these rates the graphics cards often have jitter and/or other pixel clock errors.

Currently the 8-bit data acquisition of high-bandwidth digital oscilloscopes is used for this measurement, despite the fact that the measurement is used for DACs having a greater resolution than 8 bits, i.e., 10-bit DACs. Therefore in addition to the above-mentioned signal impairments, the-test instrument platform (digital oscilloscope) also introduces quantization error and noise.

In known automatic methods for computer graphics cards the measurement of DAC linearity involves (i) a priori knowledge of the locations (time windows) of the levels to be measured, including measuring "DC levels"—holding the output constant while the voltage measurement takes place, or (ii) for dynamic signals knowledge of clock rates, level positions on the ramp, etc. Related prior automatic methods for professional and television video linearity measurement do not apply because the ramp steps are filtered using reconstruction filters in these band-limited video applications, i.e., all steps on the ramp are removed which removes resolution information. The VESA standard requires measurement of the resolution, which means there is not a priori knowledge of how many steps there are on the required ramp. The video line ramp requirement means that a lower speed approach may not be used.

What is desired is a high-speed method of automatic measurement of resolution, monotonicity, differential linearity and integral linearity for DACs in the presence of random noise, quantization error and other non-linear and linear distortions and interferences.

BRIEF SUMMARY OF THE INVENTION

Accordingly the present invention provides a high-speed method of automatically measuring DAC linearity in the presence of noise, quantization error and other distortions. The method acquires and quantizes an analog ramp output from the DAC corresponding to a digital ramp input to produce a quantized ramp, determines a start and end of the quantized ramp to estimate an ideal ramp, obtains a difference between the quantized ramp and the ideal ramp to produce a quantized periodic signal (triangular or sinusoidal), determines a frequency for a qualified peak from an FFT of the quantized periodic signal, produces a mask filtered periodic signal from an iFFT around the qualified peak, and determines a sample window spanning a local maximum and minimum for each period of the mask filtered periodic signal. Each ramp step corresponds to the sample window for each period, and the ramp step levels are the averages of the samples within each sample window. From the step levels in DAC LSB's, resolution, monotonicity, differential linearity and integral linearity are determined for the DAC.

The objects, advantages and other novel features are apparent from the following detailed description when read in conjunction with the appended claims and attached drawing.

DETAILED DESCRIPTION OF THE INVENTION

Figure 1:
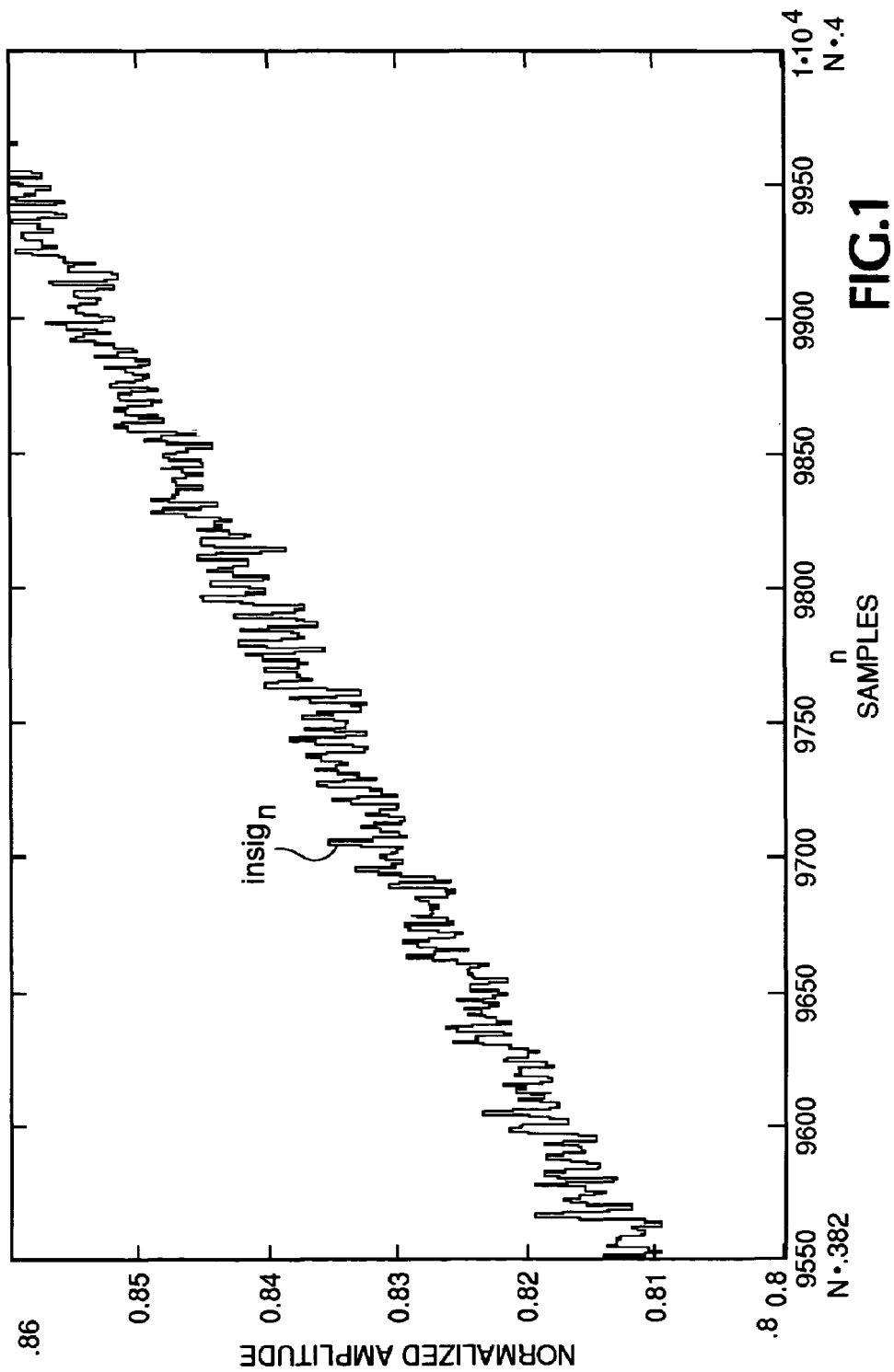
FIG. 1 is a graphic waveform view of a portion of an analog ramp output from a DAC in response to a digital ramp input.
Figure 2:
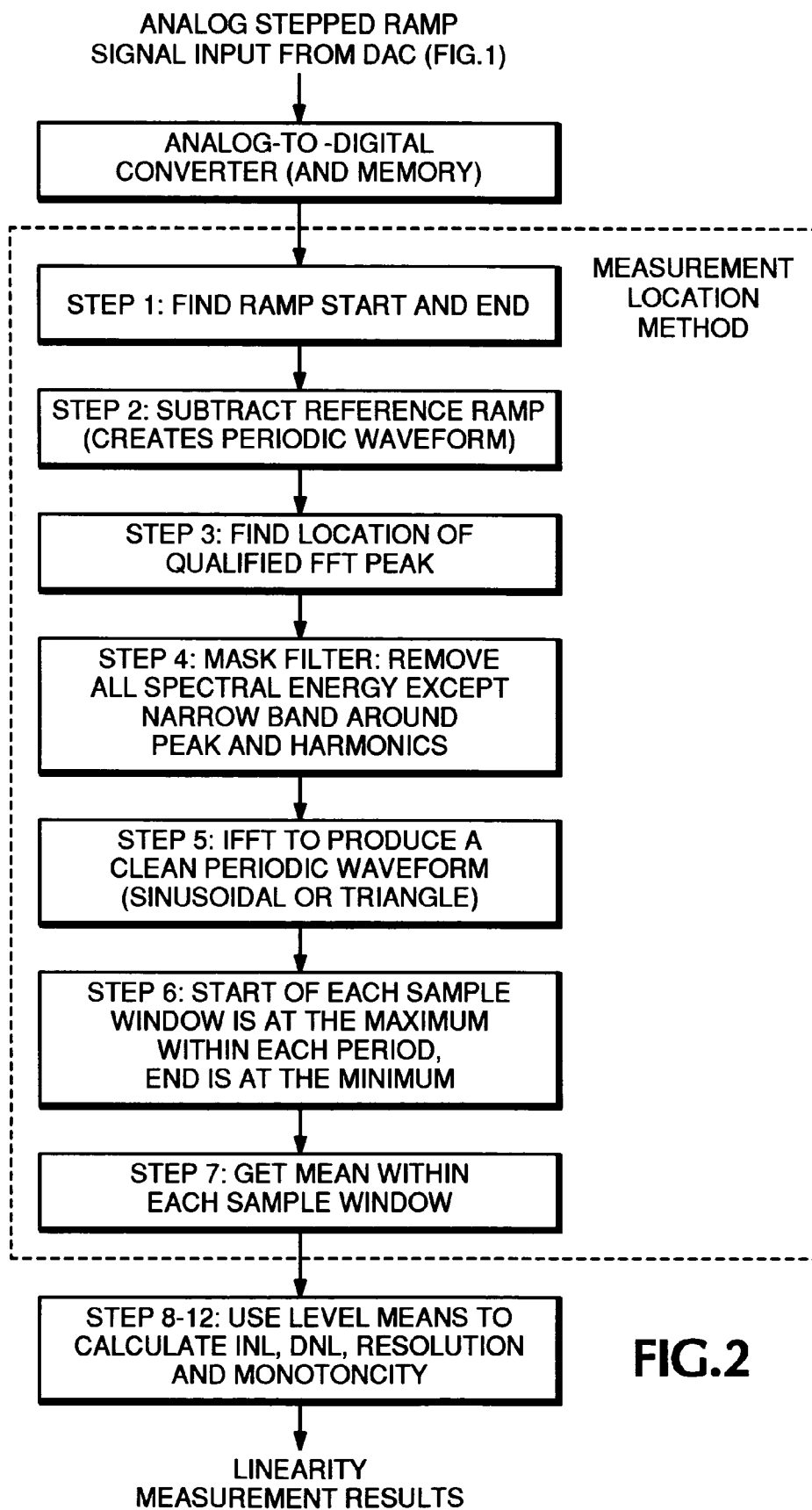
FIG. 2 is a flowchart diagram view of a high-speed method of automatic measurement of DAC linearity according to the present invention.
Figure 3:
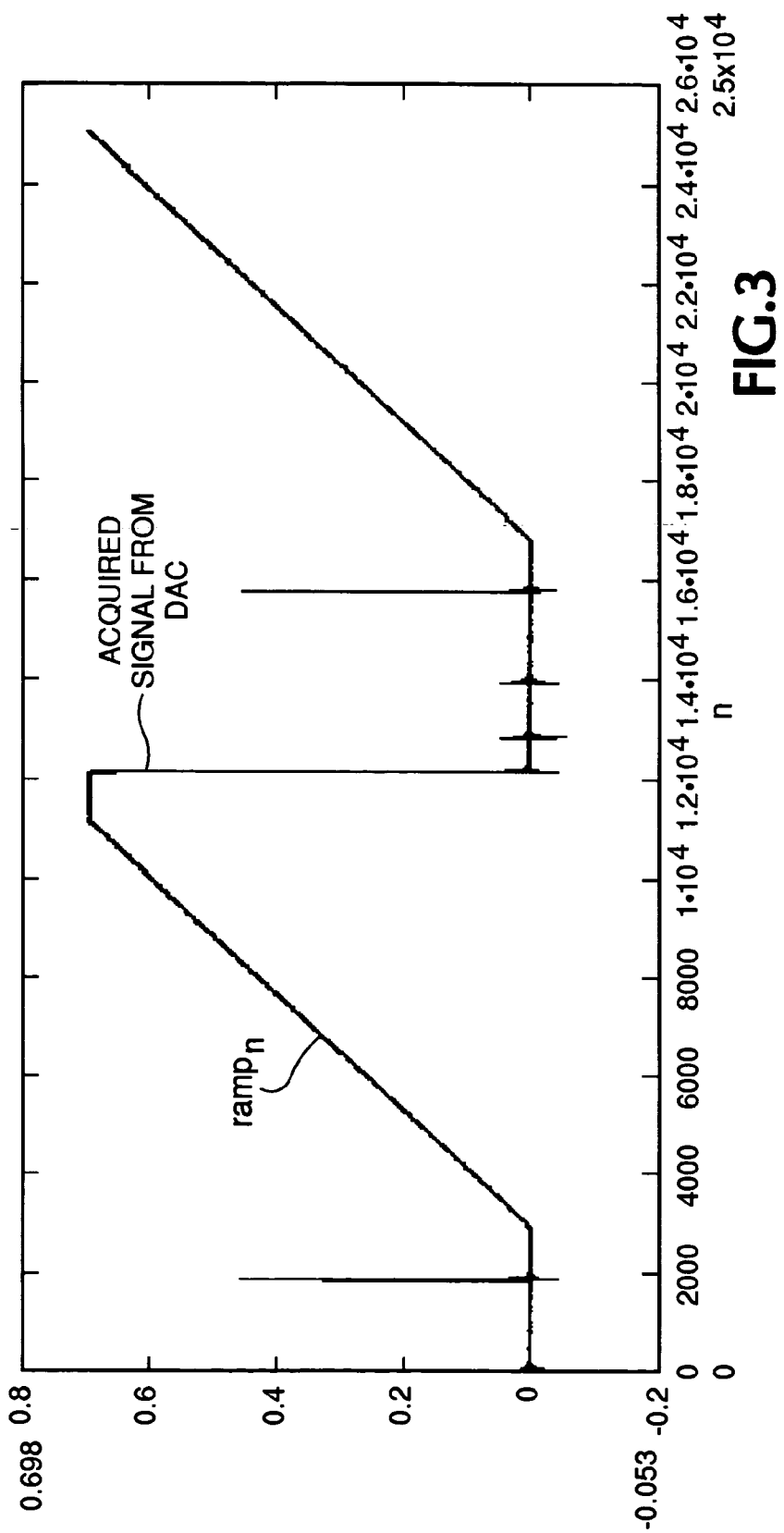
FIG. 3 is a graphic waveform view of a portion of an acquired and quantized ramp output from the DAC.
Figure 4:
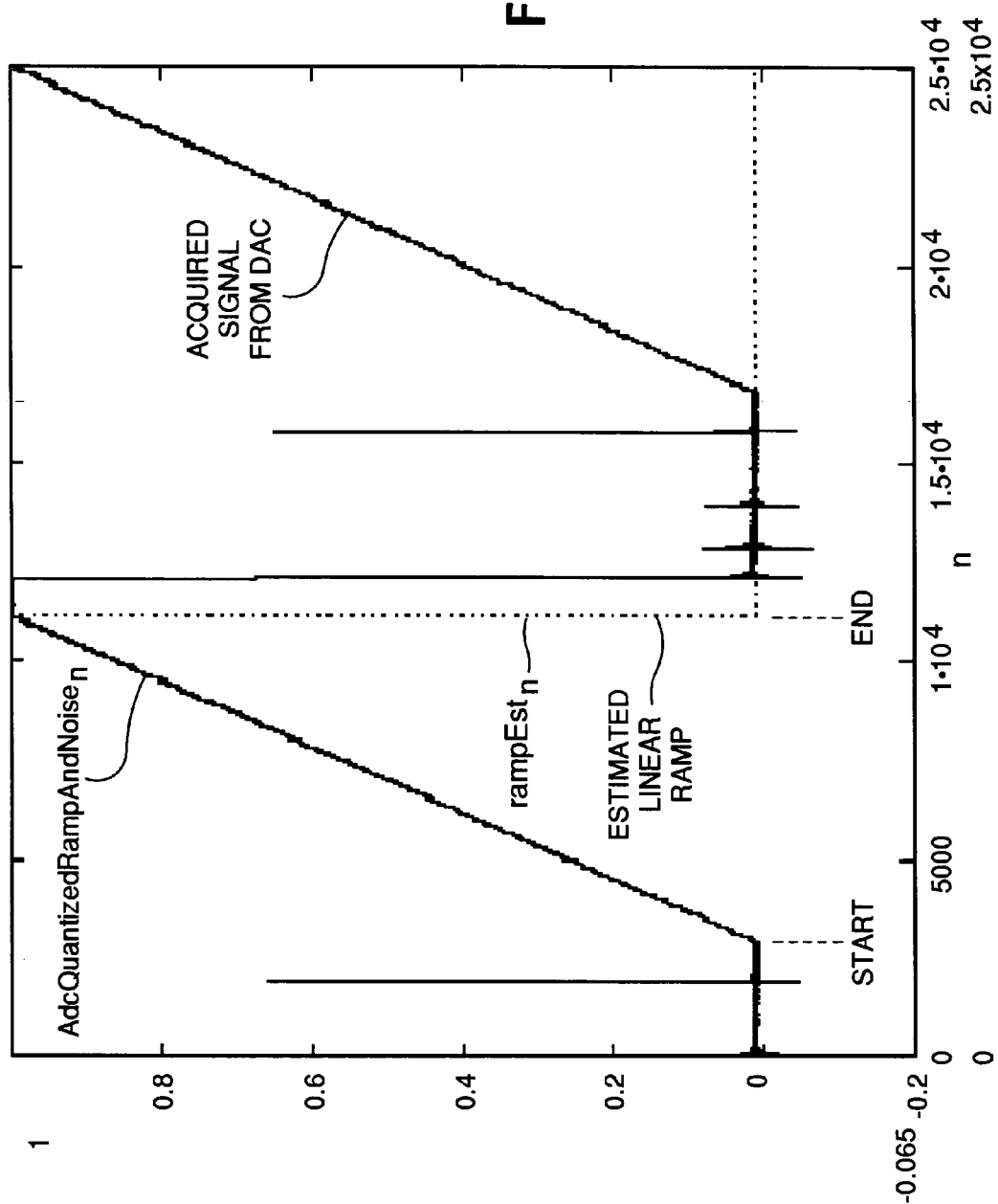
FIG. 4 is the graphic waveform view of FIG. 3 showing an estimated or ideal linear ramp according to the present invention.

An acquired and quantized ramp, such as that shown in FIG. 3, is processed as shown in FIG. 2 as follows:

Step 1. Find the start and end of the quantized ramp (using maximum correlation coefficient—see U.S. Pat. No. 5,661,527)—start:=(time1, voltage1) and end:=(time2, voltage2). See FIG. 4 where a corresponding estimated or ideal ramp is shown as a dashed line between the start and end of the quantized ramp.

Figure 5:
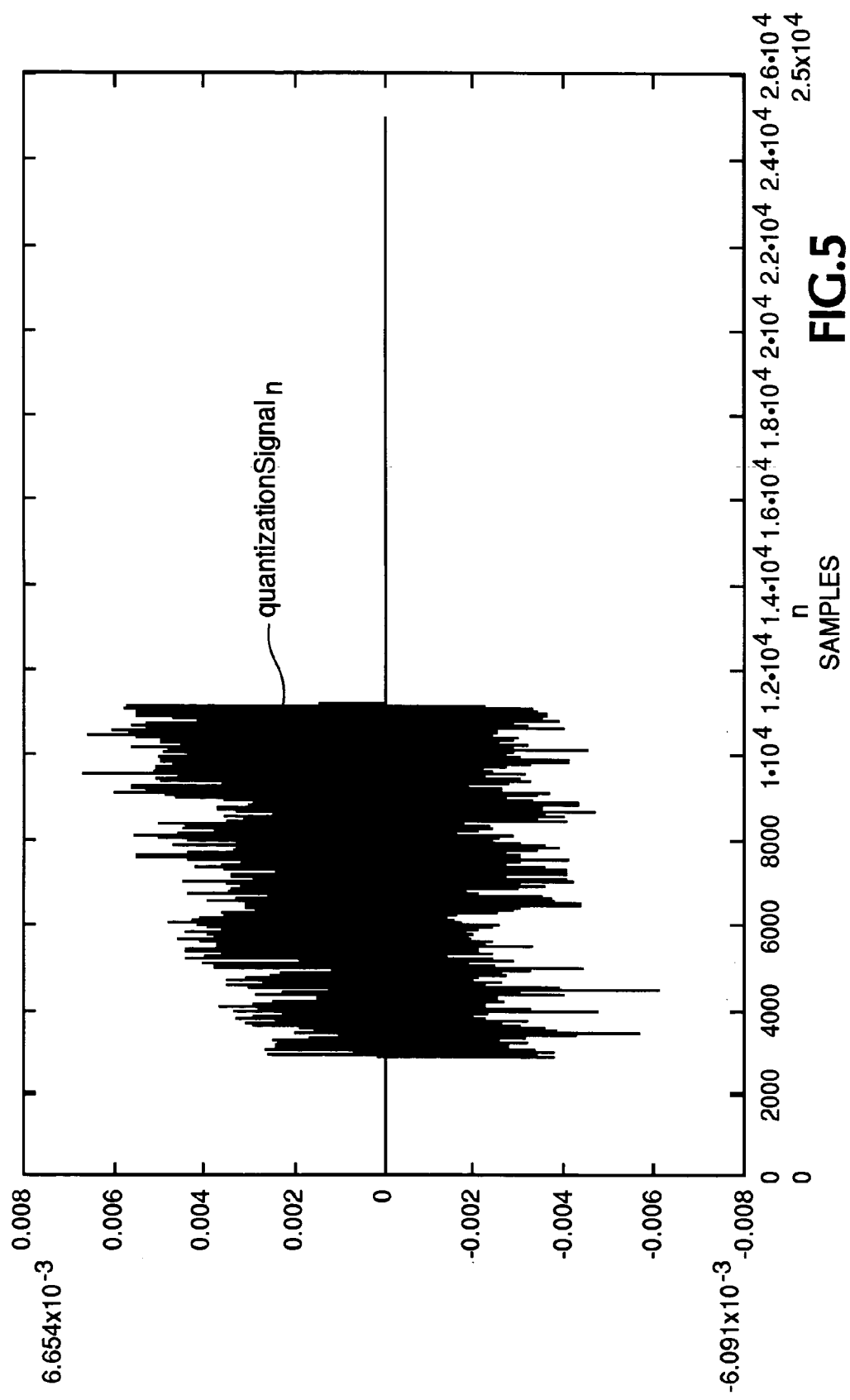
FIG. 5 is a zoomed waveform view of a difference between the quantized ramp of FIG. 3 and the estimated linear ramp of FIG. 4 according to the present invention.
Figure 6:
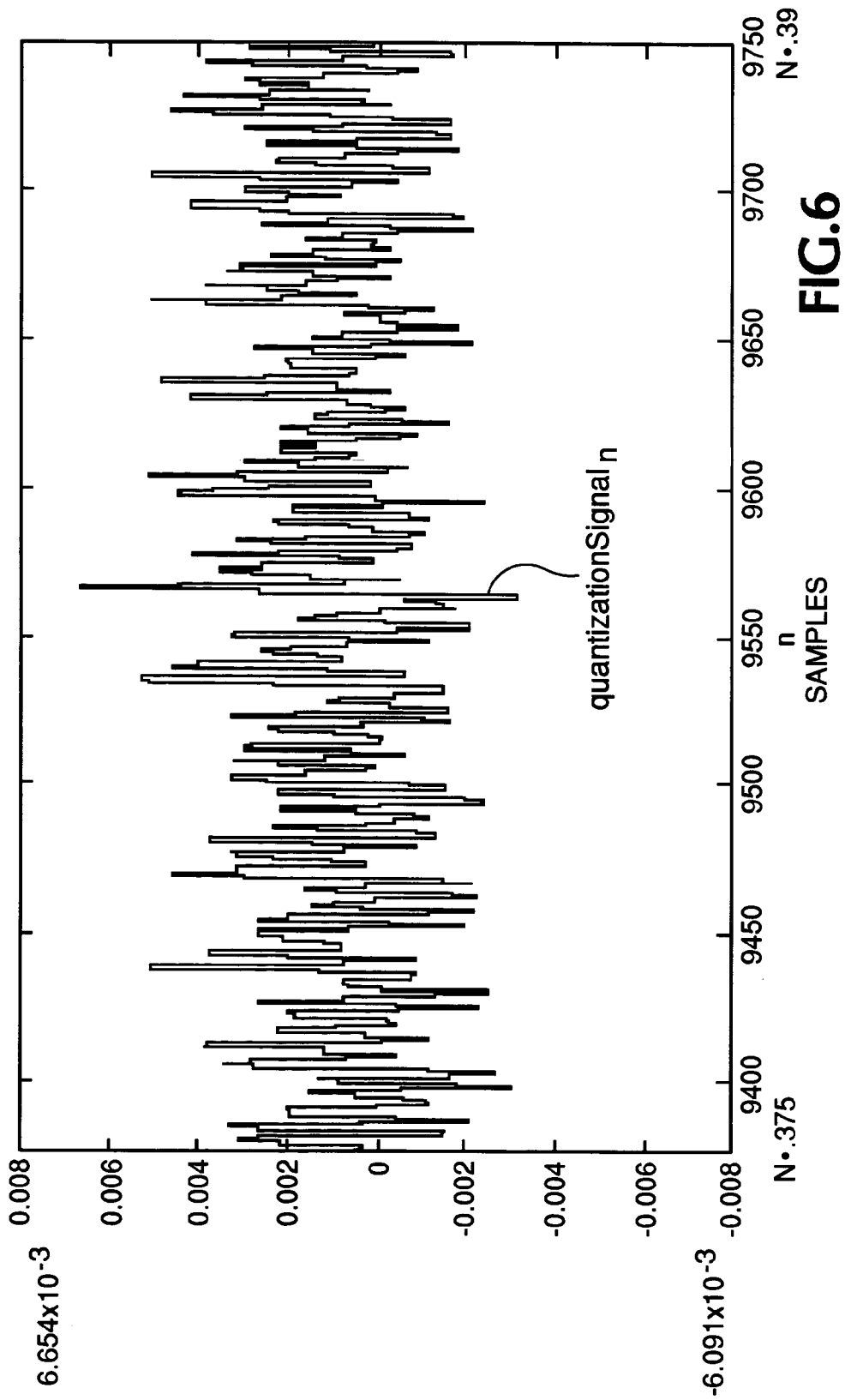
FIG. 6 is an expanded view of a portion of the waveform view of FIG. 5.

Step 2. Subtract the ideal ramp from the quantized ramp, leaving a quantized periodic triangular waveform only, i.e., subtract the estimated ramp of FIG. 4 from the quantized ramp. FIG. 5 shows the difference between the two ramps, and FIG. 6 is an expanded view of a portion of FIG. 5 showing a distorted quantized periodic triangular waveform resulting from the ramp steps or increments including noise and quantization errors.

Figure 7:
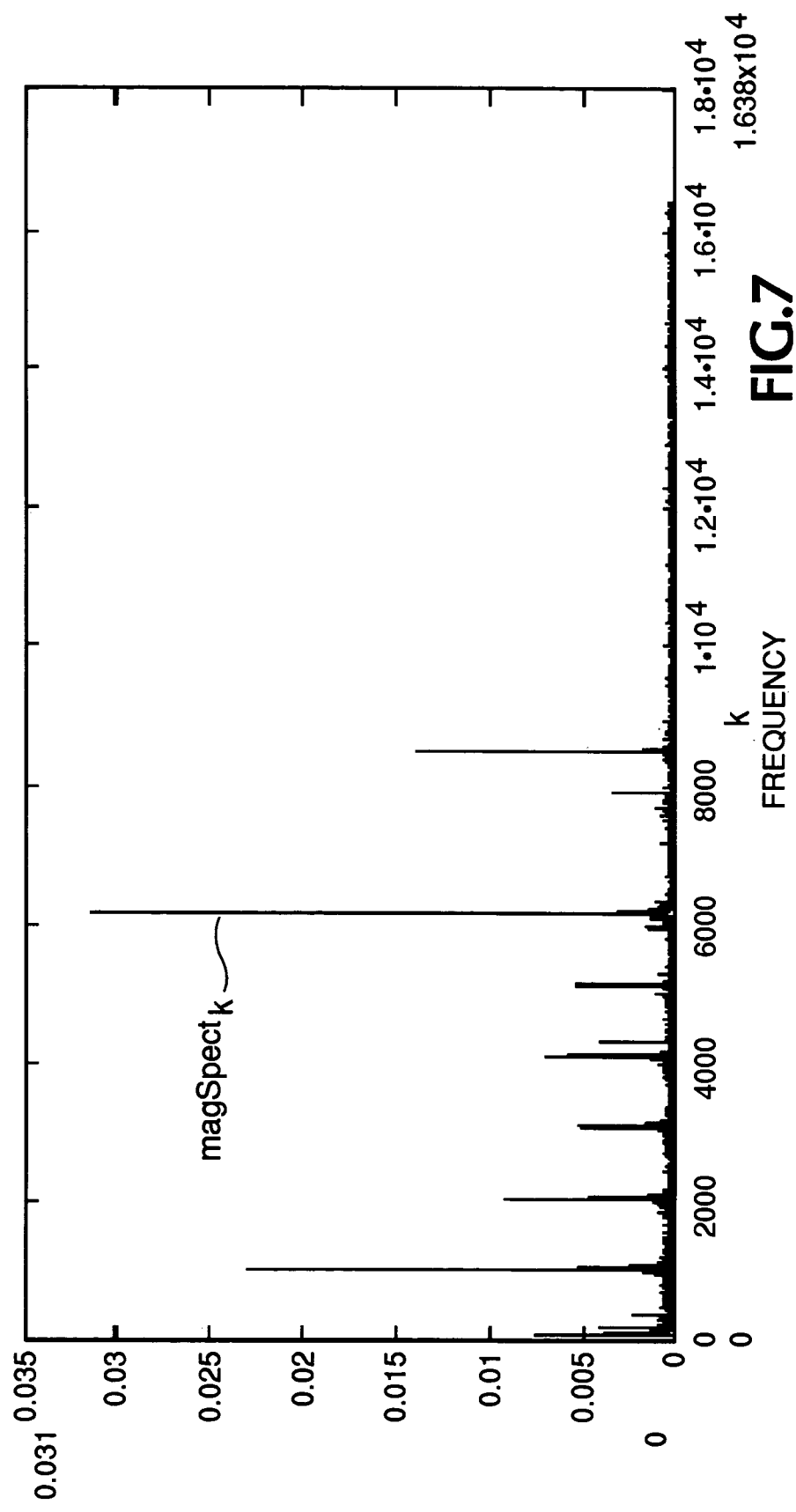
FIG. 7 is a graphic spectrum view of the waveform of FIG. 6.

Step 3. Find a frequency for a maximum magnitude of a qualified peak from FFT data—qualification depends on such factors as: if the frequency corresponds to a resolution known to be too high or too low (less than 4-bit and greater than 11-bit for example); and whether or not some power of two (or near power of 2) steps is expected (all of which may be application specific). If no qualifying information is available, the frequency corresponding to the maximum magnitude peak from the FFT data is used. FIG. 7 shows the FFT spectrum for the quantized periodic triangular waveform of FIG. 5—the highest peak is clock noise which is rejected since it corresponds to a resolution higher than the maximum in this application. Bit resolution is the $\log_2$ (rampTime/freqPeriod) where the period is 1/frequency from the FFT spectrum. The qualified peak found in this illustration is the first peak shown.

Figure 8:
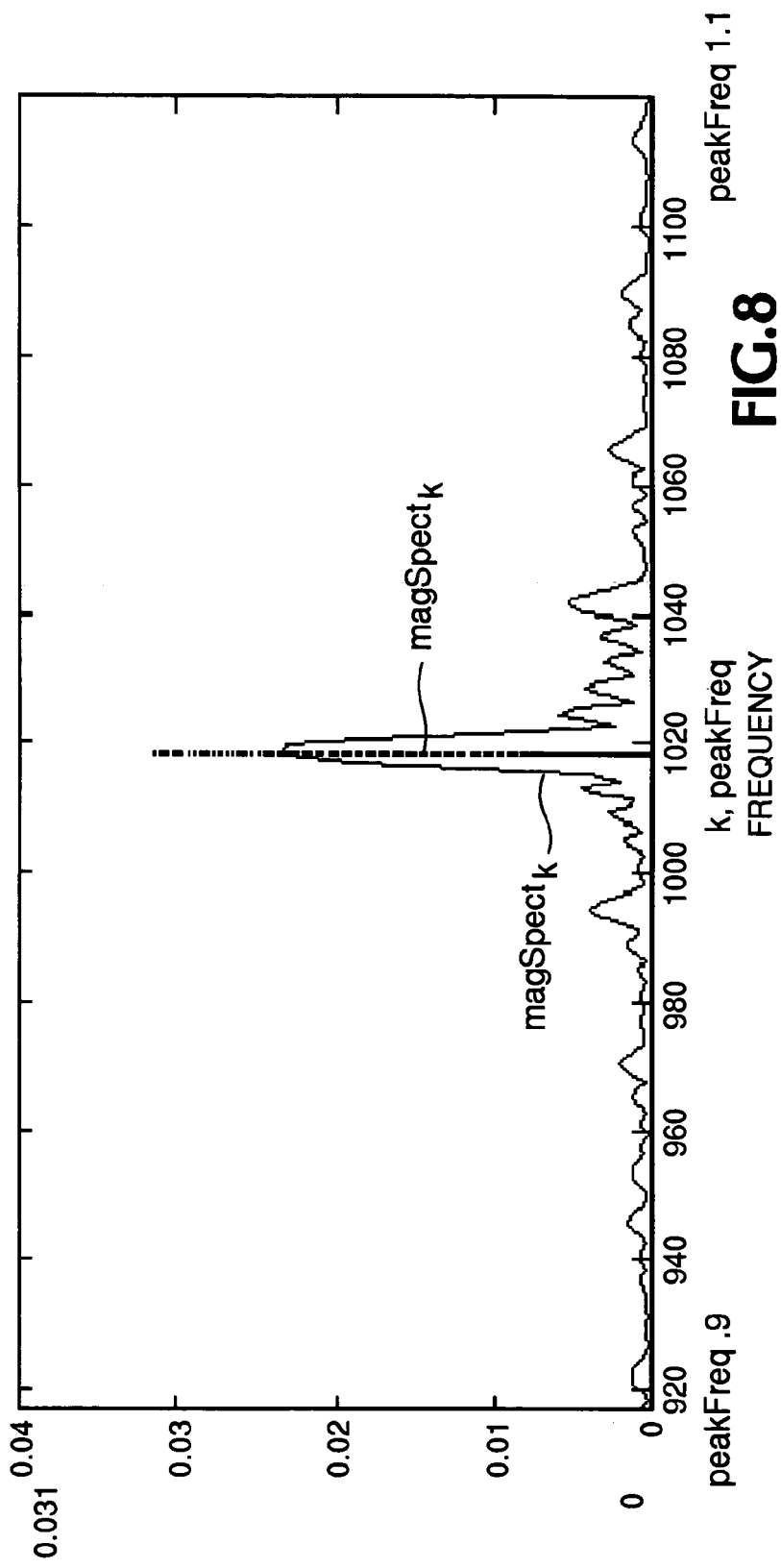
FIG. 8 is an expanded graphic spectrum view of FIG. 7 about a qualified frequency peak in the spectrum according to the present invention.

Step 4. "Mask" filter out all but the frequency of the qualified peak and a first few harmonics—in case of excessive impairment in higher frequencies the harmonics may be eliminated also. A wider bandwidth around peaks increases jitter tracking (for step edges that are displaced from nominal locations) while also passing more noise. FIG. 8 shows the masked portion of the spectrum of FIG. 7 expanded about the qualified peak.

Figure 9:
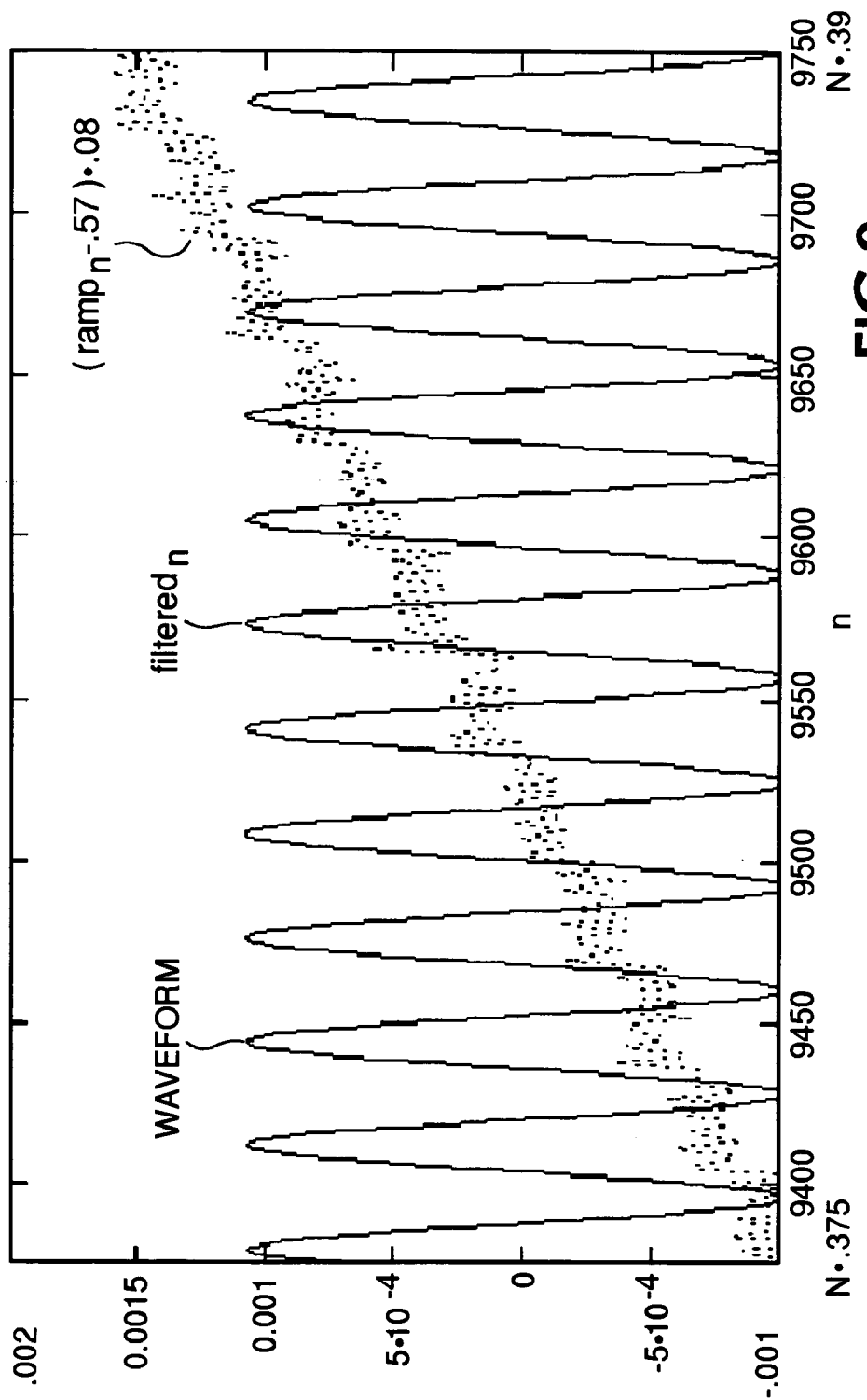
FIG. 9 is a graphic waveform view of a mask filtered quantized periodic waveform generated from the view of FIG. 8 according to the present invention.

Step 5. Perform an inverse FFT to produce a mask filtered quantized periodic (triangular or sinusoidal) waveform having a duration that for typical bandwidths used extends well beyond the start and end of the ramp. FIG. 9 shows a sinusoidal waveform, although a triangular waveform may be used if it is known that there is no correlated noise that could pose as harmonics.

Figure 10:
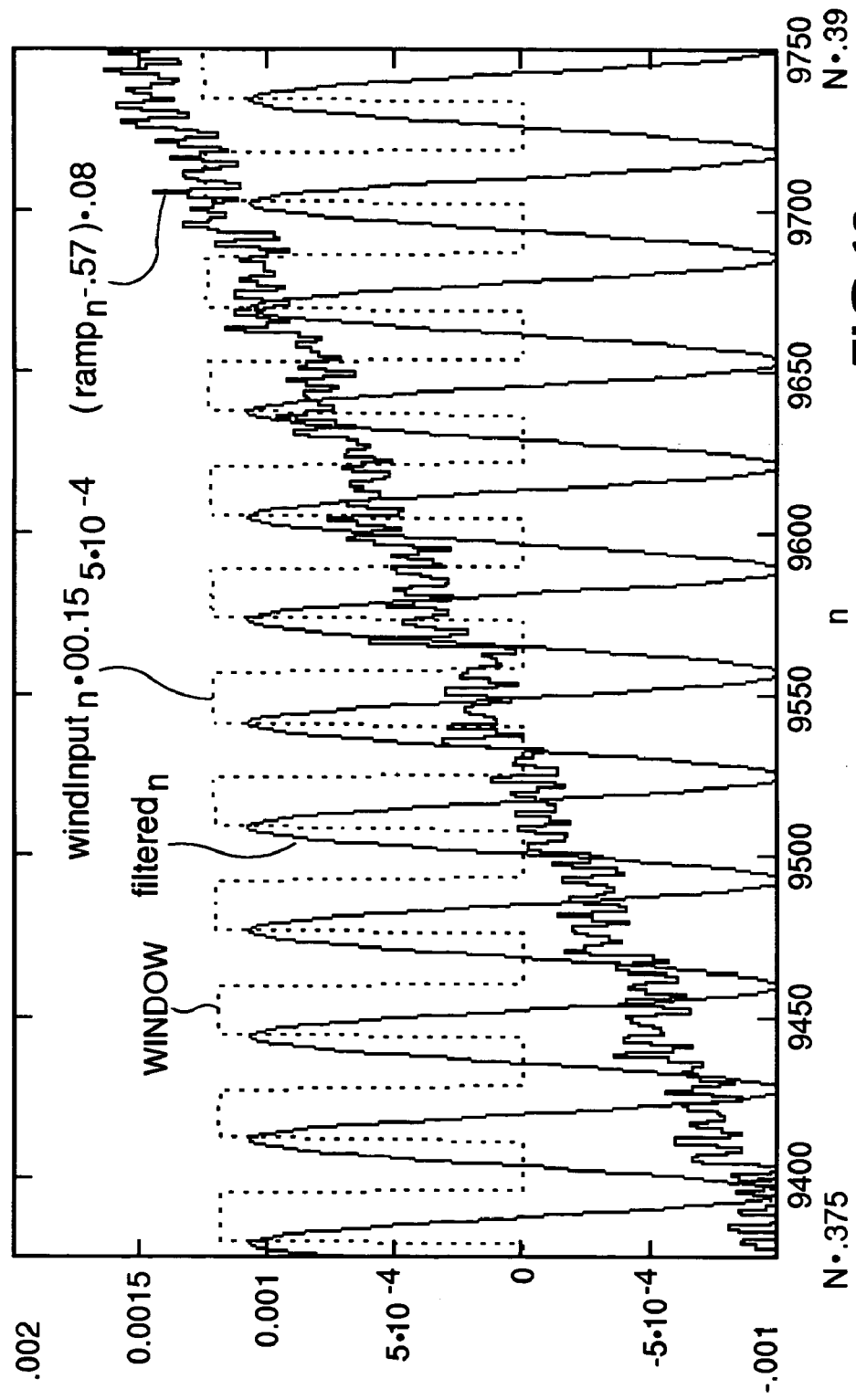
FIG. 10 is a graphic waveform view of windowing with respect to the mask filtered quantized periodic waveform of FIG. 9 according to the present invention.

Step 6. For each period of the filtered periodic waveform a sample window start is chosen at a local maximum and a sample window end is chosen at a local minimum—the time windows are found (i) between the start and end of the ramp, (ii) one period before the start of the ramp, and (iii) one period after the end of the ramp. FIG. 10 shows the sample windows for measuring the level of each step—the maximum of each period corresponds to the window start and the minimum corresponds to the window end.

Step 7. Get average levels at each position of the sample window and, if the position qualifies (by step size relative to ramp amplitude divided by the total number of steps) as a step level, convert to LSB's. If near the ramp start or end, this step may be ignored if the amplitude is too low (false start or end). In FIG. 10 the solid line staircase illustrates the mean measurement result.

The output from the above method gives the levels in LSB units for a given DAC code. For the complete calculation of each of the measurements (resolution, INL, DNL and monotonicity) the means of each level are used per the VESA specification and as shown below:

Step 8 (Resolution). Divide the periodic (triangular or sinusoidal) waveform period into the ramp length (end−start), take the $\log_2$ of this result and round to the nearest integer.

samplesBetweenSteps:=peakFreq*totalRampSamples where totalRampSamples is the number of digitized samples between the start and end of the ramp and peakFreq is the frequency value of the qualified peak from the FFT spectrum.

Figure 11:
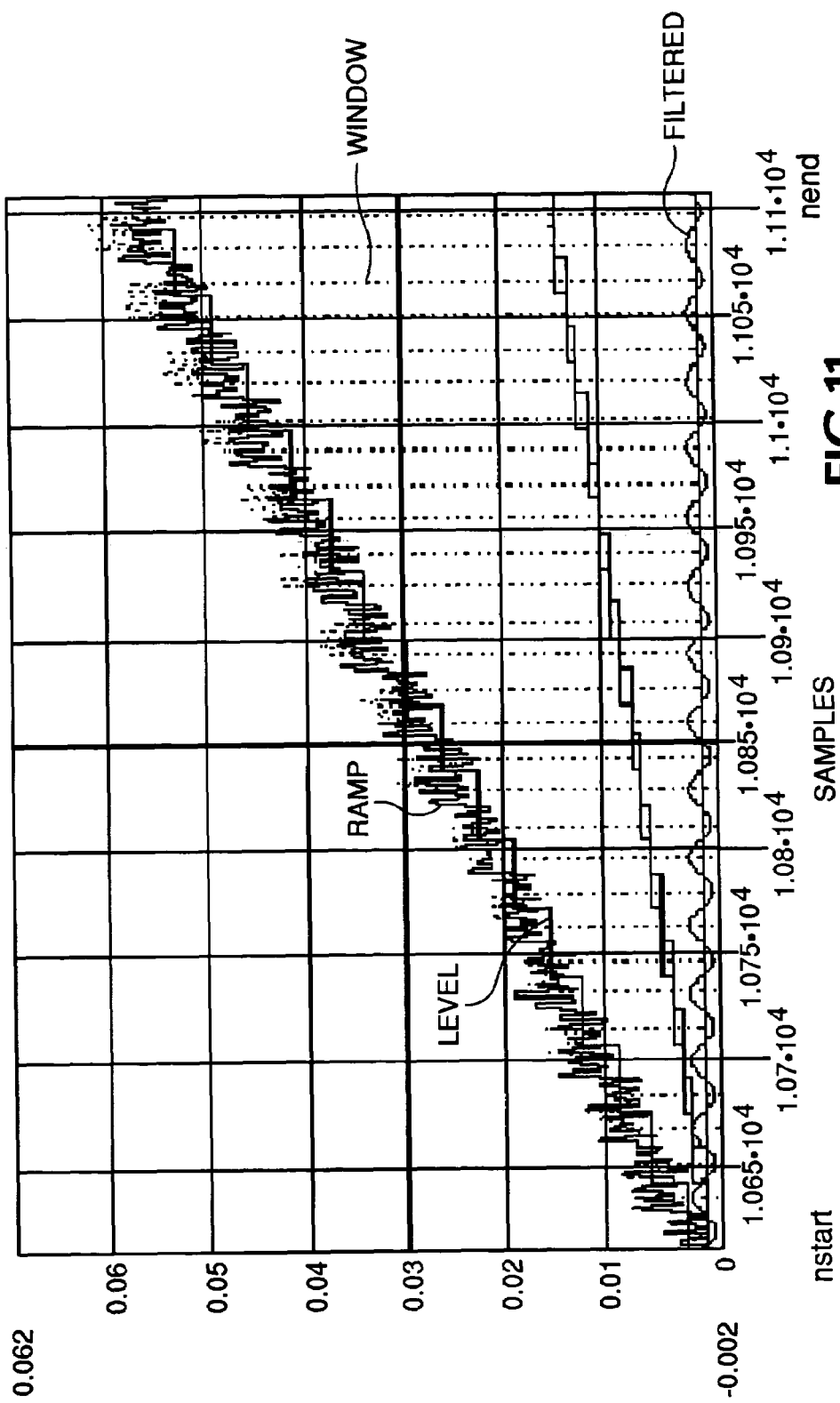
FIG. 11 is a graphic waveform view that is a composite view showing average ramp step levels according to the present invention.

As an example for the staircase in FIG. 11:
samplesBetweenSteps=32.191
samplesBetweenTopAndBottom:
=topLocation−botLocation where the topLocation and botLocation correspond to the start and end of the ramp.

totalRampSteps:=samplesBetweenTopAndBottom/
samplesBetweenSteps
totalRampSteps=255.199
estBits:=floor(0.5+$\log_2$ (totalRampSteps))
estBits=8

Step 9 (INL). Largest deviation of levels in LSB units from "code" value, where the "code" value is the input in LSB's of the DAC. The DAC input is a ramp in DAC code: 0, 2, 3, . . . , maxCode−1 (255 for 8-bit DAC).

maxCode:=levelsToMeasure=256    (8-bit    DAC)
code:=0 . . . maxCode−1
LSBc:=(level$_{maxCode-1}$−level$_0$)/maxCode−1
INL$_{code}$:=(level$_{code}$−LSBc(code+1))/LSBc
maxINL:=max(INL) maxINL=2.469 LSBc
minINL:=min(INL) minINL=1.662 LSBc
integralLinearityError:=if(|maxINL|>|minINL|, |maxINL|, |minINL|)
integralLinearityError=2.469

Figure 12:
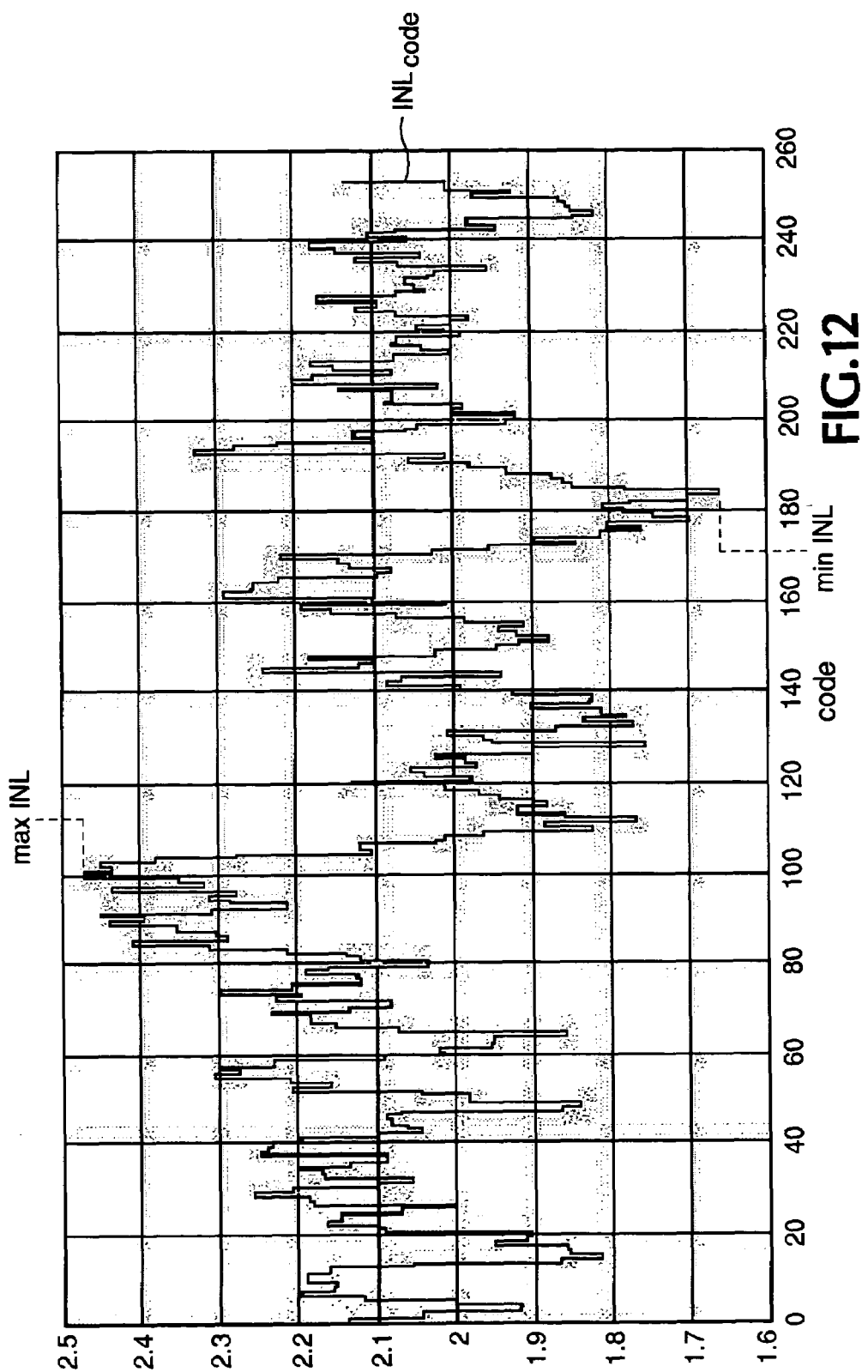
FIG. 12 is a graphic view of integral linearity as a function of code according to the present invention.

FIG. 12 shows INL as a function of code taken from a supplied test file.

Step 10 (DNL). Get deltas—differences between levels of adjacent regions.

Step 11. LSB error—subtract one from normalized steps in LSB units. NormalizedStep$_{code:=(levelcode-}$level$_{if(code>0, code-1, 0)}$)/LSBc NormalizedStep$_0$:=1
DNL:=NormalizedStep−1 DNL$_0$=0

Step 12. DNL=largest absolute LSB error
maxDNL:=max(DNL) maxDNL=0.317 LSBc
minDNL:=min(DNL) minDNL=−0.204 LSBc
differentialLinearityError:=if(|maxDNL|>|minDNL|, |maxDNL|, |minDNL|)
differentialLinearityError=0.317

Figure 13:
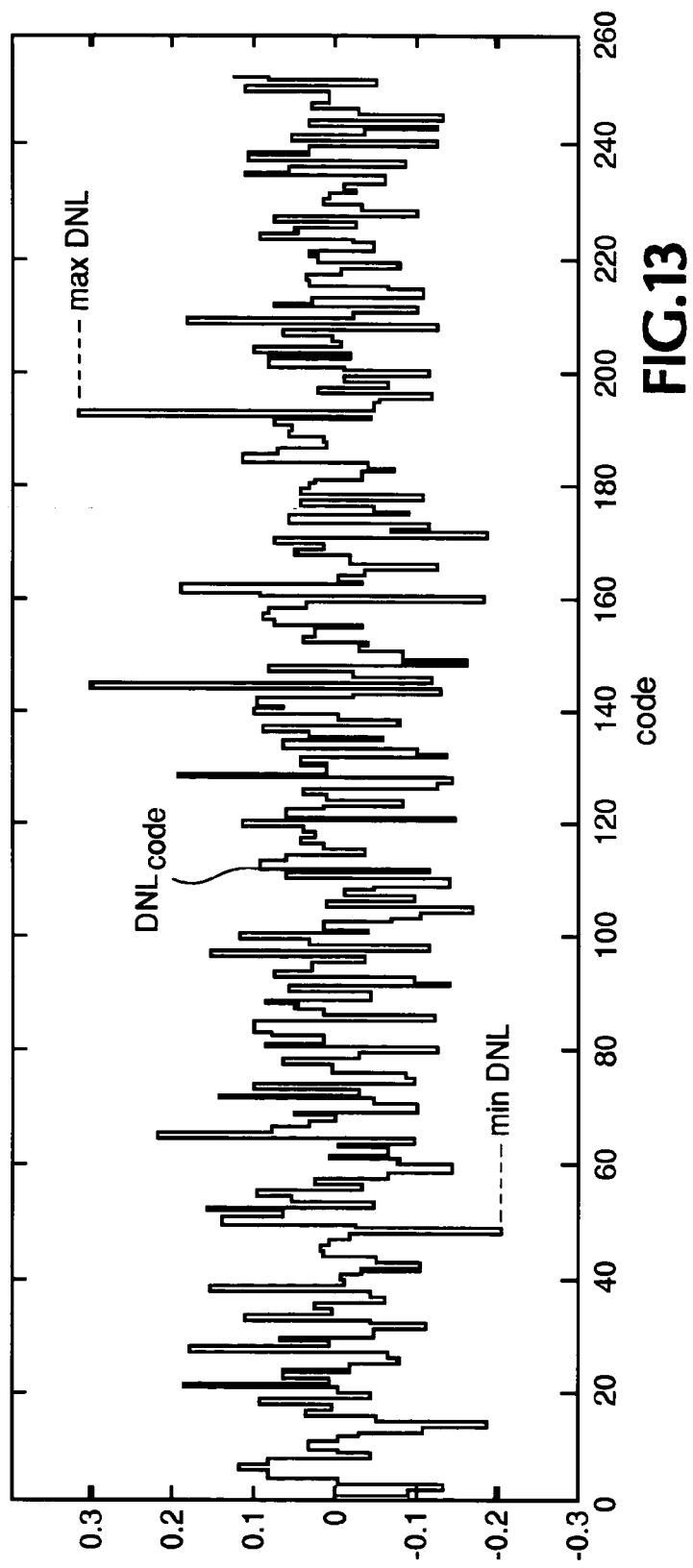
FIG. 13 is a graphic view of differential linearity as a function of code according to the present invention.
Figure 14:
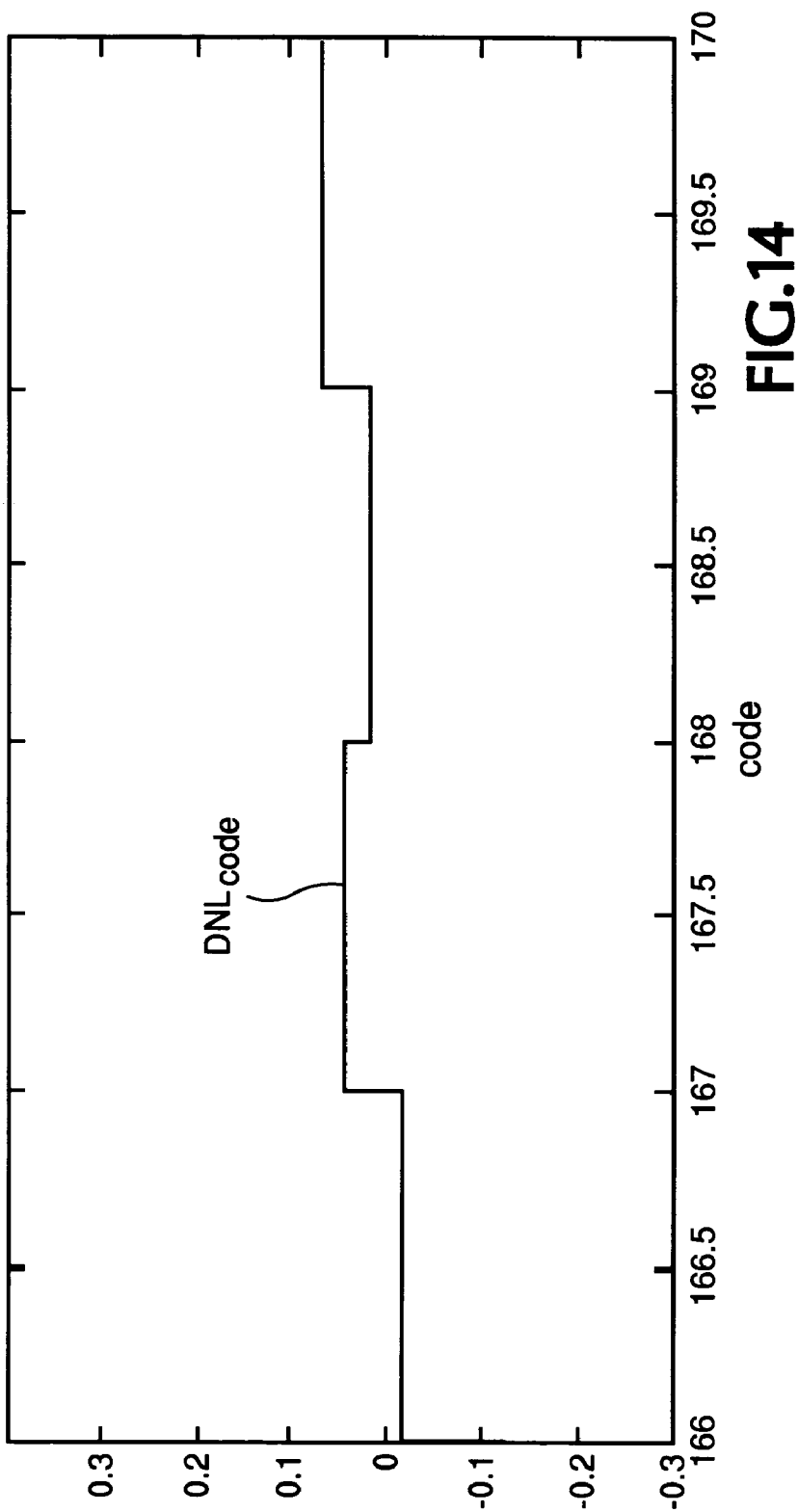
FIG. 14 is an expanded view of a portion of FIG. 13.

FIG. 13 shows DNL as a function of code, with FIG. 14 showing an expanded portion of FIG. 13 between plotStartCode:=166 and plotEndCode:=170

Step 13 (Monotonicity). If any DNL is <0, monotonicity is false (non-monotonic), else true (monotonic).

The above described method has the advantages of adapting to signal timing, resolution, etc. because the timing and resolution, for example, are independent of the input signal video format, while also being robust in the presence of linear and non-linear distortions and noise since it works even when noise/impairments are too large to see any steps at all visually, allowing the use of high-speed, lower-resolution analog-to-digital converters for acquiring the DAC analog ramp output for measurement, such as are found in high-speed digital oscilloscopes.

Thus the present invention provides a high-speed measurement of DAC linearity in the presence of noise, quantization errors and other distortions by obtaining a qualified frequency peak from a spectrum for a quantized ramp difference signal, which is the difference between a quantized ramp output from the DAC less an estimated or ideal ramp, by performing an iFFT to convert a portion of the spectrum surrounding the qualified frequency peak to a quantized periodic waveform (triangular or sinusoidal), by obtaining an average level for each step in the ramp using a sample window over one-half period of the periodic waveform defined by the filtered waveform's local maximums and minimums, and by determining from the mean step levels the resolution, monotonicity, differential linearity and integral linearity for the DAC.

What is claimed is:

1. A high-speed method of measuring linearity for a digital-to-analog converter comprising the steps of:
    obtaining a qualified frequency peak from a spectrum of an acquired and quantized analog step ramp output by the digital-to-analog converter in response to a digital ramp input;
    deriving a periodic signal from a portion of the spectrum surrounding the qualified frequency peak; and
    determining for each period of the periodic signal a sample window within which a ramp step level is to be determined.

2. The method as recited in claim 1 further comprising the step of calculating linearity parameters for the digital-to-analog converter from the ramp step levels determined within the sample windows.

3. The method as recited in claim 1 wherein the obtaining step comprises the steps of:
    determining an ideal ramp corresponding to the acquired and quantized analog ramp;
    subtracting the ideal ramp from the acquired and quantized analog ramp to produce a quantized periodic signal;
    transforming the quantized periodic signal to a frequency domain to produce the spectrum; and
    obtaining from the spectrum the qualified frequency peak as a function of specified qualifying information.

4. The method as recited in claim 1 wherein the deriving step comprises the step of transforming the portion of the spectrum to a time domain to produce the periodic signal.

5. The method as recited in claim 1 wherein the determining step comprises the step of finding for each period of the periodic signal a local maximum as a start point and a local minimum as an end point for each sample window.

6. The method as recited in claim 2 wherein the calculating step comprises the steps of:
    determining total number of ramp steps as a function of a number of samples between ramp steps derived from the qualified frequency peak and of a number of samples between a start and an end of the acquired and quantized analog ramp; and
    estimating from the total number of ramp steps the resolution of the digital-to-analog converter.

7. The method as recited in claim 2 wherein the calculating step comprises the steps of:
    determining a differential linearity versus digital-to-analog converter code graph as a function of level differences between the ramp steps; and
    calculating from a maximum and minimum differential linearity value of the graph the differential linearity of the digital-to-analog converter.

8. The method as recited in claim 7 wherein the calculating step further comprises the step of determining the monotonicity of the digital-to-analog converter from the differential linearity values.

9. The method as recited in claim 2 wherein the calculating step further comprises the step of determining the integral linearity of the digital-to-analog converter from a graph of intergral linearity values versus digital-to-analog converter code.

* * * * *